United States Patent
Lee et al.

(10) Patent No.: US 11,714,727 B2
(45) Date of Patent: Aug. 1, 2023

(54) STUCK-AT FAULT MITIGATION METHOD FOR RERAM-BASED DEEP LEARNING ACCELERATORS

(71) Applicants: UNIST Academy-Industry Research Corporation, Ulsan (KR); THE REGENTS OF THE UNIVERSITY OF CALIFORNIA, Oakland, CA (US); KING ABDULLAH UNIVERSITY OF SCIENCE AND TECHNOLOGY, Thuwal (SA)

(72) Inventors: Jong Eun Lee, Ulsan (KR); Su Gil Lee, Ulsan (KR); Gi Ju Jung, Ulsan (KR); Mohammed Fouda, Irvine, CA (US); Fadi Kurdahi, Irvine, CA (US); Ahmed M. Eltawil, Thuwal (SA)

(73) Assignees: UNIST ACADEMY-INDUSTRY RESEARCH CORPORATION, Ulsan (KR); THE REGENTS OF THE UNIVERSITY OF CALIFORNIA, Oakland, CA (US); KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 17/581,327

(22) Filed: Jan. 21, 2022

(65) Prior Publication Data
US 2022/0245038 A1    Aug. 4, 2022

(30) Foreign Application Priority Data
Jan. 29, 2021    (KR) .................. 10-2021-0012802

(51) Int. Cl.
*G06F 11/14*    (2006.01)
*G06F 11/07*    (2006.01)

(52) U.S. Cl.
CPC ........ *G06F 11/1476* (2013.01); *G06F 11/073* (2013.01)

(58) Field of Classification Search
CPC ... G06F 11/1476; G06F 11/073; G06N 3/045; G06N 3/047
(Continued)

(56) References Cited

PUBLICATIONS https://en.wikipedia.org/wiki/Stuck-at_fault Wikipedia "stuck at fault" page, retrieved from (Year: 2023).*

(Continued)

*Primary Examiner* — Yair Leibovich
(74) *Attorney, Agent, or Firm* — Paratus Law Group, PLLC

(57) ABSTRACT

A stuck-at fault mitigation method for resistive random access memory (ReRAM)-based deep learning accelerators, includes: confirming a distorted output value (Y0) due to a stuck-at fault (SAF) by using a correction data set in a pre-trained deep learning network, by means of ReRAM-based deep learning accelerator hardware; updating an average (μ) and a standard deviation (σ) of a batch normalization (BN) layer by using the distorted output value (Y0), by means of the ReRAM-based deep learning accelerator hardware; folding the batch normalization (BN) layer in which the average (μ) and the standard deviation (σ) are updated into a convolution layer or a fully-connected layer, by means of the ReRAM-based deep learning accelerator hardware; and deriving a normal output value (Y1) by using the deep learning network in which the batch normalization (BN) layer is folded, by means of the ReRAM-based deep learning accelerator hardware.

4 Claims, 4 Drawing Sheets

(58) Field of Classification Search
USPC .......................................................... 714/42
See application file for complete search history.

(56) References Cited

PUBLICATIONS

B. Li, L. Song, F. Chen, X. Qian, Y. Chen and H. H. Li, "ReRAM-based accelerator for deep learning," 2018 Design, Automation & Test in Europe Conference & Exhibition (DATE), Dresden, Germany, 2018, pp. 815-820, doi: 10.23919/DATE.2018.8342118. (Year: 2018).*

Lixue Xia et al., "Stuck-at Fault Tolerance in RRAM Computing Systems", IEEE Journal on Emerging and Selected Topics in Circuits and Systems, Mar. 2018, pp. 102-115, vol. 8, No. 1.

Lerong Chen et al., "Accelerator-friendly Neural-network Training: Learning Variations and Defects in RRAM Crossbar", 2017 Design, Automation and Test in Europe (DATE), 2017, pp. 19-24, IEEE.

Chenchen Liu et al., "Rescuing Memristor-based Neuromorphic Design with High Defects", 2017 54th Annual Design Automation Conference, Jun. 2017, pp. 1-6, IEEE, Austin, TX, USA.

* cited by examiner (a) Without SAF (b) With SAF applied (c) With SAF and FPT applied.

STUCK-AT FAULT MITIGATION METHOD FOR RERAM-BASED DEEP LEARNING ACCELERATORS

CROSS-REFERENCE TO RELATED APPLICATION

This application claims priority to Korean Patent Application No. 10-2021-0012802 (filed on Jan. 29, 2021), which is hereby incorporated by reference in its entirety.

BACKGROUND

The present invention relates to a stuck-at fault mitigation method for resistive random access memories (ReRAM)-based deep learning accelerators, and more particularly, to a stuck-at fault mitigation method for ReRAM-based deep learning accelerators which mitigates a stuck-at fault occurring in the ReRAM as one of next-generation memories capable of being used for deep learning by free parameter tuning (FPT).

Conventional resistive random access memories (ReRAM) can provide a very fast matrix vector multiplication (MVM) function as well as a high Roff-Ron ratio and a high device density through simple current summing in a crossbar structure. Accordingly, the ReRAM is helping to activate deep neural network accelerators and optimization techniques.

In a normal case, a current in the ReRAM gradually changes until the current reaches a specific target current range, which is an allowable current range for one digital state in a multi-bit operation, and then electric pulses in an opposite direction are applied to return to an original resistance state.

However, in an abnormal case, a stuck-at fault (SAF) in which resistance does not change well occurs. When the SAF occurs, a resistance value of the corresponding memories is stuck to a low resistance state (LRS) or high resistance state (HRS), and a desired value, that is, a weight value of the network, is not properly usable and the model performance deteriorates.

To solve this problem, in the related arts, as in related documents 1 to 3, there are disclosed methods of remapping for avoiding a stuck-at fault, post-correcting an error caused by a fault, or retraining by considering the stuck-at fault.

However, there are problems in that the remapping method and the post-correcting method need to know where the stuck-at fault occurred, and the retraining method requires additional hardware or the entire training data set for retraining.

Therefore, there is a need for more efficient technologies capable of mitigating the stuck-at fault (SAF) that may occur in resistive random access memories (ReRAM) used in deep learning accelerators and increasing the reliability of the corresponding memories.

PRIOR ARTS

Non-Patent Document (Non-Patent Document 0001) L. Xia et al., "Stuck-at fault tolerance in RRAM computing systems," IEEE Journal on Emerging and Selected Topics in Circuits and Systems, vol. 8, no. 1, pp. 102-115, March 2018.
(Non-Patent Document 0002) L. Chen et al., "Accelerator-friendly neural-network training: Learning variations and defects in RRAM crossbar," in Design, Automation & Test in Europe Conference & Exhibition (DATE), 2017
(Non-Patent Document 0003) C. Liu et al., "Rescuing memristor-based neuromorphic design with high defects," in Proceedings of the 54th Annual Design Automation Conference 2017.

SUMMARY

In order to solve the problems, an object of the present invention is to provide a stuck-at fault mitigation method for resistive random access memories (ReRAM)-based deep learning accelerators by applying free parameter tuning (FPT) in which an average $\mu$ and a standard deviation $\sigma$ of a batch normalization (BN) layer are updated by using a distorted output value Y0 so as to mitigate a stuck-at fault (SAF) occurring in resistive random access memories (ReRAM) used for deep learning accelerators and increase the reliability of the corresponding memories.

Further, another object of the present invention is to provide a stuck-at fault mitigation method for resistive random access memories (ReRAM)-based deep learning accelerators in which a subset selected randomly from an arbitrary data set is provided to be used as a correction data set so as not to require the data set and also require separate additional hardware and an average $\mu$ and a standard deviation $\sigma$ of a batch normalization (BN) layer are updated and then folded into a convolution layer or a fully-connected layer.

In order to achieve the object, the present invention provides a stuck-at fault mitigation method for resistive random access memory (ReRAM)-based deep learning accelerators comprising: a stuck-at fault confirming step of confirming a distorted output value (Y0) due to a stuck-at fault (SAF) by using a correction data set in a pre-trained deep learning network, by means of ReRAM-based deep learning accelerator hardware; an updating step of updating an average ($\mu$) and a standard deviation ($\sigma$) of a batch normalization (BN) layer by using the distorted output value (Y0), by means of the ReRAM-based deep learning accelerator hardware; a folding step of folding the batch normalization (BN) layer in which the average ($\mu$) and the standard deviation ($\sigma$) are updated into a convolution layer or a fully-connected layer, by means of the ReRAM-based deep learning accelerator hardware; and a deriving step of deriving a normal output value (Y1) by using a deep learning network in which the batch normalization (BN) layer is folded, by means of the ReRAM-based deep learning accelerator hardware.

As described above, according to the present invention, by applying the free parameter tuning (FPT) in which the average ($\mu$) and the standard deviation ($\sigma$) of the batch normalization (BN) layer are updated by using the distorted output value (Y0), there are effects of mitigating a stuck-at fault (SAF) after determining whether or not there is the stuck-at fault (SAF) without requiring for confirming information about a location of the stuck-at fault (SAF) occurring in the ReRAM used in the deep learning accelerators and a stuck-at fault (SAF) pattern, and increasing the reliability of the corresponding memories.

Further, since a subset selected randomly from an arbitrary data set is provided to be used as a correction data set, and the average ($\mu$) and the standard deviation ($\sigma$) of the batch normalization (BN) layer are updated and then folded into the convolution layer or the fully connected layer, there is no need to build a huge amount of arbitrary data sets and no separate additional hardware is required, so that there is an effect that it is more efficient than a conventional correction method.

Further, in the free parameter tuning (FPT) of the present invention, a training method such as backpropagation is not used, and only the forward parameters are updated, so that the calculation of the differential value requiring a large amount of computation is also unnecessary, and only a small amount of correction data set other than a large amount of arbitrary data set is sufficient. In addition, since the correction data set is a calibration data set in which data labeling is not performed, there is a significant effect capable of not performing a data labeling process in which a person classifies and processes a huge amount of data in a form that the deep learning network can learn by itself.

DETAILED DESCRIPTION

Terms used in the present invention adopt general terms which are currently widely used as possible by considering functions in the present invention, but the terms may vary depending on intentions of those skilled in the art, precedents, emergence of new technology, etc. Further, in a specific case, a term arbitrarily selected by an applicant is present and in this case, a meaning of the term will be disclosed in detail in a corresponding description part of the present invention. Accordingly, a term used in the present invention should be defined based on not just a name of the term but a meaning of the term and contents throughout the present invention.

Unless otherwise contrarily defined, all terms used herein including technological or scientific terms have the same meanings as those generally understood by those skilled in the art. Terms which are defined in a generally used dictionary should be interpreted to have the same meaning as the meaning in the context of the related art, and are not interpreted as an ideal meaning or excessively formal meanings unless clearly defined in the present application.

Figure 1:
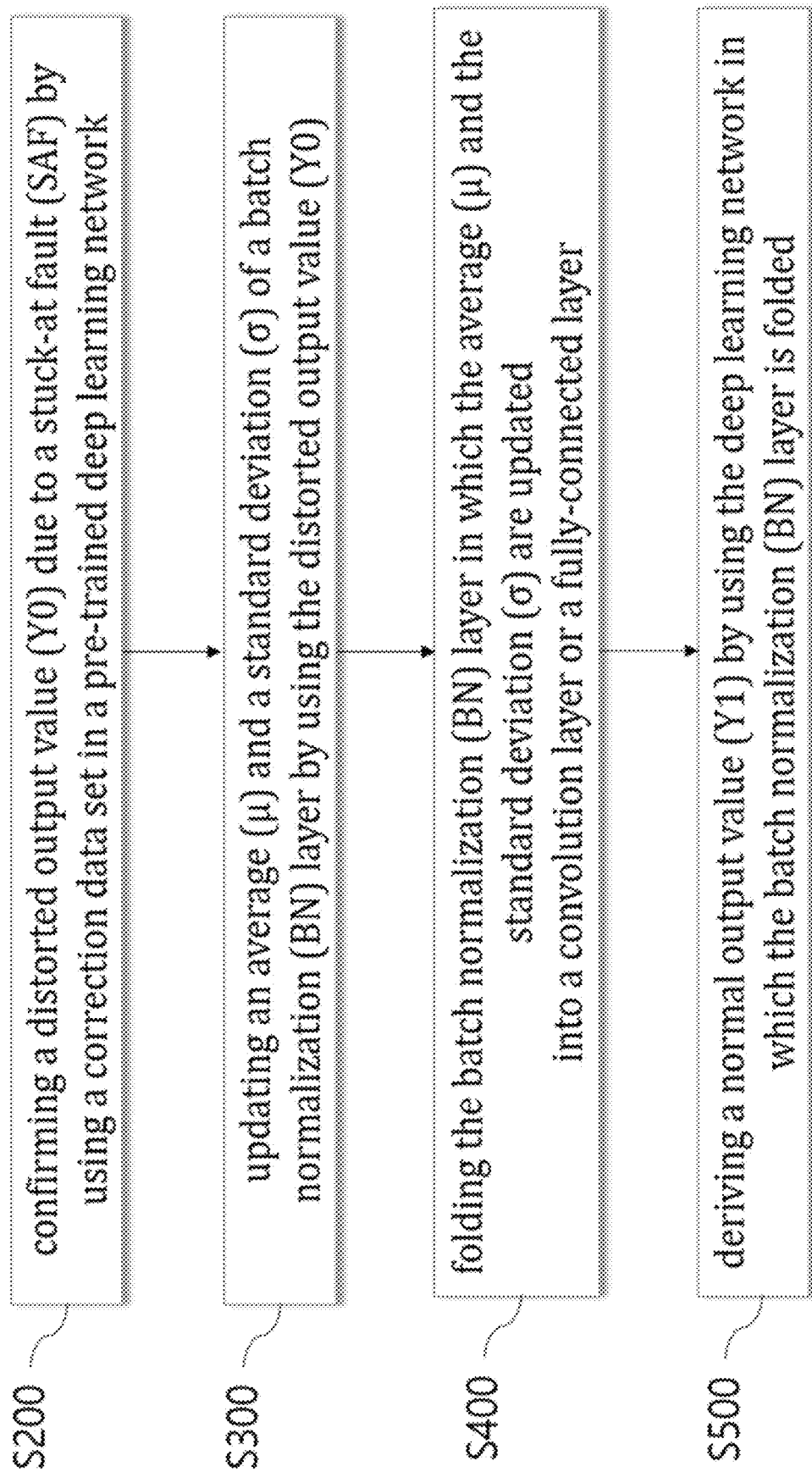
FIG. 1 is a flowchart of a stuck-at fault mitigation method for resistive random access memory (ReRAM)-based deep learning accelerators according to the present invention.

Hereinafter, embodiments of the present invention will be described in detail with reference to the accompanying drawings. FIG. 1 is a flowchart of a stuck-at fault mitigation method for resistive random access memory (ReRAM)-based deep learning accelerators according to the present invention.

First, the present invention provides a stuck-at fault mitigation method for resistive random access memories (ReRAM)-based deep learning accelerators by applying free parameter tuning (FPT) in which a distorted output value Y0 is mitigated and a normal output value Y1 is derived by updating an average μ and a standard deviation σ as forward parameters of a batch normalization (BN) layer in a deep learning network so as to mitigate a stuck-at fault (SAF) occurring in the ReRAM used for deep learning accelerators and increase the reliability of the corresponding memories.

That is, the present invention may be referred to as free parameter tuning (FPT) in that backpropagation learning is not performed.

Referring to FIG. 1, the stuck-at fault mitigation method for the ReRAM-based deep learning accelerators of the present invention includes a stuck-at fault confirming step (S200), an updating step (S300), a folding step (S400), and a deriving step (S500).

Here, the stuck-at fault mitigation method for the ReRAM-based deep learning accelerators of the present invention is executed by ReRAM-based deep learning accelerator hardware 100. Alternatively, as a subject implementing the present invention, a simulator may also be used.

Meanwhile, the stuck-at fault mitigation method for the ReRAM-based deep learning accelerators according to the present invention may further include a training step (S100) so that a deep learning network may be trained. In the training step (S100), the deep learning network may be trained by using the arbitrary data set by means of the ReRAM-based deep learning accelerator hardware 100.

The arbitrary data set is a set including a huge amount of data having correct answer values, and may be provided so that the deep learning network may be trained.

In the deep learning network, at least one of a distorted output value Y0 and a normal output value Y1 may be derived by using the following [Equation 1] based on affine transformation.

$$y = \gamma\left(\frac{x - \mu}{\sqrt{\sigma^2 - \varepsilon}}\right) + \beta \quad \text{[Equation 1]}$$

Here, y is an output value, x is an input value, μ and σ are an average and a standard deviation as forward parameters, β and γ are a bias value and an affine transformation weight as backward parameters, and ε is a constant.

In other words, the deep learning network may include at least one of a batch normalization (BN) layer, a convolution layer, and a fully-connected layer, and the batch normalization (BN) layer enables normalization and affine transformation using the following [Equation 1] based on the affine transformation. In the following [Equation 1], a part in a parentheses may be a normalization process, and the other part may be an affine transformation process. Here, the μ and σ are an average and a standard deviation as normalization parameters, and are forward parameters that may be updated in a forward direction. The β and γ are a bias value and an affine transformation weight as affine transformation parameters, and are backward parameters that may be updated in a backward direction. In addition, the ε is a constant and is a very small value added to prevent the denominator from becoming 0, most preferably $10^{-5}$.

In general, the affine transformation refers to a point correspondence in which an n-dimensional space is represented by a linear equation. The affine transformation may reduce an internal covariance shift problem and improve training performance.

In addition, the batch normalization (BN) layer in the deep learning network may be executed differently from the training step (S100), the updating step (S300), and the deriving step (S500).

Figure 2:
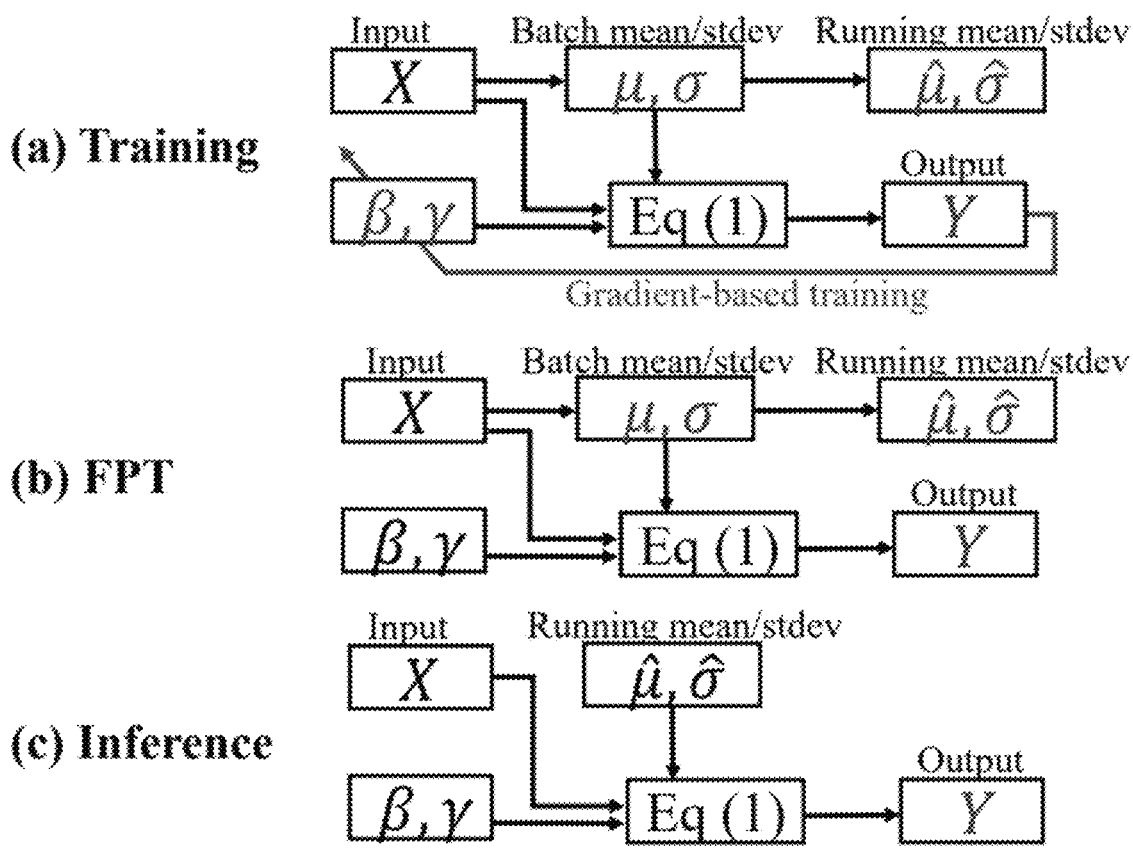
FIG. 2 is a diagram illustrating normalization and affine transformation parameters for each step according to an embodiment of the present invention.

FIG. 2 is a diagram illustrating normalization and affine transformation parameters for each step according to an embodiment of the present invention. Referring to FIG. 2(a), in the training step (S100), an input value x included in an arbitrary data set is input to [Equation 1], and the forward parameters including the average μ and the standard deviation σ of the batch normalization (BN) layer are used to derive an output value y. In this case, the output value y may be at least one of a distorted output value Y0 and a normal output value Y1.

In addition, in the training step (S100), the backward parameter may be trained in the backward direction by using a gradient descent method. In general, the gradient descent method is a method for repeating until obtaining a slope of a function by an optimization algorithm for finding a primary approximation and continuing to move toward a lower absolute value of the slope to reach an extreme value, and there is an effect of finding an optimal solution when the gradient descent method is applied to various starting points. That is, the four parameters may be updated only during training.

Further, referring to FIG. 2(b), in the updating step (S300), an input value x included in a correction data set is input to [Equation 1], and the average μ and the standard deviation σ as the forward parameters of the batch normalization (BN) layer and the bias value β and the affine transformation weight γ as the backward parameters obtained from the training step (S100) are used to derive an output value y. In this case, the output value y may be at least one of a distorted output value Y0 and a normal output value Y1.

In addition, referring to FIG. 2(c), in the deriving step (S500), an input value x included in the arbitrary data set is input to [Equation 1], and an exponential moving average (EMA) of the average μ and the standard deviation σ of the batch normalization (BN) layer updated from the updating step (S300) and the backward parameters obtained from the training step (S100) are used to derive an output value y. In this case, the derived output value y may most preferably be a normal output value Y1.

Next, in the stuck-at fault confirming step (S200), the distorted output value Y0 due to the stuck-at fault (SAF) is confirmed by using the correction data set in the pre-trained deep learning network by means of the ReRAM-based deep learning accelerator hardware 100.

Meanwhile, in the stuck-at fault confirming step (S200), if the stuck-at fault (SAF) is confirmed, multiple distorted output values Y0 may be confirmed according to the number of neurons, and if the stuck-at fault (SAF) is not confirmed, the normal output value Y1 may be confirmed according to the number of neurons.

That is, in the stuck-at fault confirming step (S200), there is an effect of easily determining whether there is the stuck-at fault (SAF) by using only an output value output from the deep learning network without the need to confirm information about a location where the stuck-at fault (SAF) occurs and a stuck-at fault (SAF) pattern.

Figure 4:
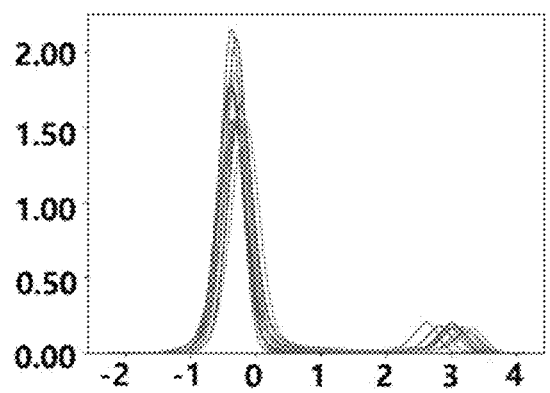
FIG. 4 is a diagram illustrating output values derived from a deep learning network according to (a) a case where there is no stuck-at fault according to an embodiment of the present invention, (b) a case where the stuck-at fault is confirmed, and (c) a case where the present invention is applied after the stuck-at fault is confirmed.'
Figure 4:
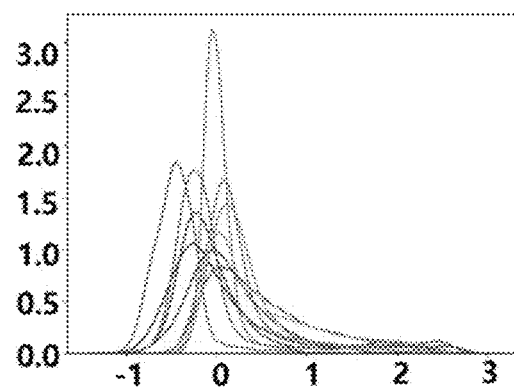
Figure 4:
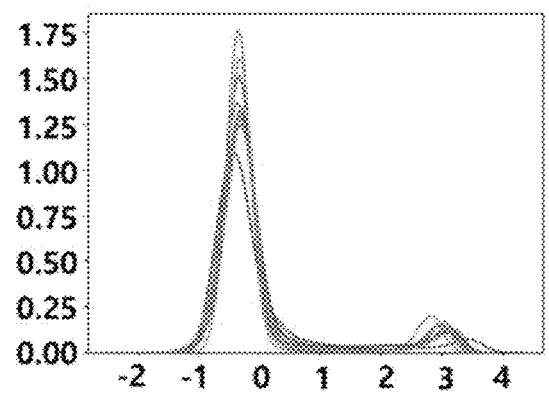

At this time, the stuck-at fault confirming step (S200) is characterized in that the most preferably distorted output value Y0 is represented by a Gaussian distribution modeling the outputs of multiple neurons, as illustrated in FIG. 4.

Next, in the updating step (S300), the average μ and the standard deviation σ of the batch normalization (BN) layer are updated by using the distorted output value Y0 by means of the ReRAM-based deep learning accelerator hardware 100.

Most preferably, the updating step (S300) is characterized in that the updating of parameters other than the average μ and the standard deviation σ of the batch normalization layer (BN) does not occur. In other words, since it is configured that the bias value β and the affine transform weight γ, which are the backward parameters included in [Equation 1], are not updated and only the average μ and the standard deviation σ as the forward parameters are updated, it is possible to significantly reduce the computational amount of the deep learning network, and accordingly, there is a remarkable effect of enabling quick mitigation for the stuck-at fault (SAF).

Next, in the folding step (S400), the batch normalization (BN) layer, in which the average μ and the standard deviation σ are updated, is folded into a convolution layer or a fully-connected layer, by means of the ReRAM-based deep learning accelerator hardware 100. Here, there is a case where the batch normalization (BN) layer exists in the deep learning network, and folding means being removed by merging.

On the other hand, in the updating step (S300), the batch normalization (BN) layer may be added to one side of the convolution layer or the fully-connected layer so that the stuck-at fault is mitigated when there is no batch normalization (BN) layer in the deep learning network.

In this case, in the updating step (S300), the average μ and the standard deviation σ of the added batch normalization (BN) layer may be updated by using the distorted output value Y0 output from the convolution layer or the fully-connected layer.

In the folding step (S400), the batch normalization (BN) layer may be folded into the convolution layer or the fully-connected layer so that the deriving step (S500) is simplified.

Accordingly, since the folding in which the batch normalization (BN) layer is merged into the convolution layer or the fully-connected layer is enabled, there is an effect that additional separate hardware is not required.

Next, in the deriving step (S500), the normal output value Y1 is derived by using the deep learning network in which the batch normalization (BN) layer is folded by means of the ReRAM-based deep learning accelerator hardware 100.

Figure 3:
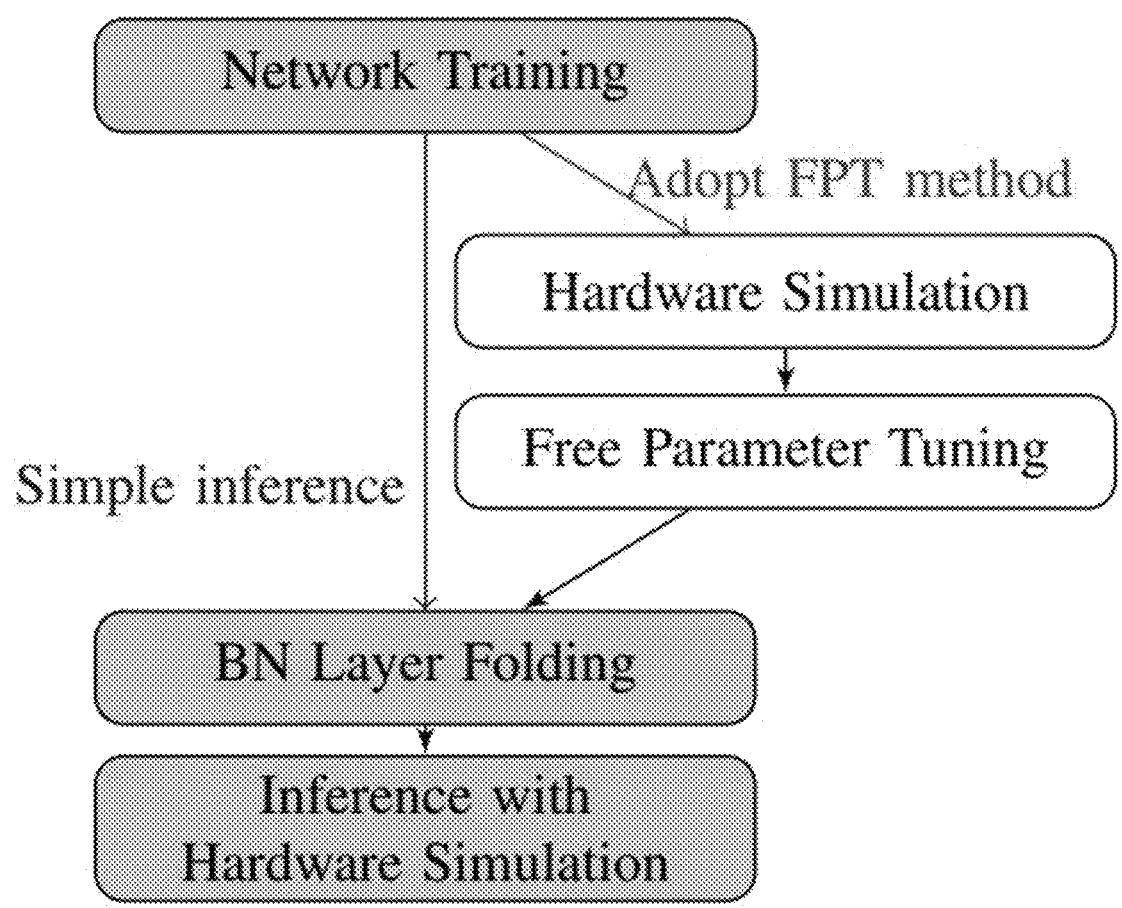
FIG. 3 is a flowchart illustrating a case where free parameter tuning (FPT) of the present invention is applied or not according to an embodiment of the present invention.

FIG. 3 is a flowchart illustrating a case where free parameter tuning (FPT) of the present invention is applied or not according to an embodiment of the present invention. FIG. 4 is a diagram illustrating output values derived from a deep learning network according to (a) a case where there is no stuck-at fault according to an embodiment of the present invention, (b) a case where the stuck-at fault is confirmed, and (c) a case where the present invention is applied after the stuck-at fault is confirmed.

First, when the deep learning network trained by means of the ReRAM-based deep learning accelerator hardware 100 is mapped into the ReRAM and the stuck-at fault (SAF) occurs, the distribution of the output values of the batch normalization (BN) layer may be distorted as illustrated in FIG. 4(b).

Referring to FIG. 3, in a conventional case to which the free parameter tuning (FPT) of the present invention is not applied, if the stuck-at fault (SAF) does not occur, the distribution of the distorted output value Y0 and the normal output value Y1 may be shown as illustrated in FIG. 4(a). For example, among the normal output values Y1, the largest peak may be identified near 0, and a small peak may be identified near 3.

In the conventional case to which the free parameter tuning (FPT) of the present invention is not applied, if the stuck-at fault (SAF) occurs, the distribution of the distorted output value Y0 may be shown as illustrated in FIG. 4(b). That is, since the distortion pattern varies for each neuron, the average of the output value y may be moved and the standard deviation may be increased. Accordingly, there is a problem in that the performance of the deep learning network may be greatly deteriorated.

On the other hand, when the stuck-at fault (SAF) occurs, if the free parameter tuning (FPT) of the present invention is applied, the average μ and the standard deviation σ of the added batch normalization (BN) layer in the deep learning network may be corrected by using the distorted output value Y0. Accordingly, the distribution of the distorted output value Y0 as illustrated in FIG. 4(b) is restored to the normal output value Y1 as illustrated in FIG. 4(c), and the performance of the deep learning network trained by means of the ReRAM-based deep learning accelerator hardware 100 is also improved.

In addition, in the free parameter tuning (FPT) of the present invention, a training method such as backpropagation is not used, and only the forward parameters are updated, so that the calculation of the differential value requiring a large amount of computation is also unnecessary, and only a small amount of correction data set other than a large amount of arbitrary data set is sufficient. For example, compared to 50,000 arbitrary data sets for training the deep learning network, only 1,024 correction data sets may be sufficient.

In addition, the correction data set may be a set of data in which data labeling is not performed, which may be referred to as a calibration data set. The data labeling is a process in which a person classifies and processes a huge amount of data in a form that the deep learning network can learn by itself, and thus has a remarkable effect without performing such a separate process.

In addition, since separate training is not performed when the average and the standard deviation of the batch normalization (BN) layer are updated, data without correct answer values in the correction data set may be used without a problem. The updated parameters of the batch normalization (BN) layer may be folded to be merged with the convolution layer or the fully-connected layer as an immediately previous layer, and the folding is to be merged and removed, and thus, there is an effect that separate additional hardware is not required.

Example 1

Experiment Method

In order to evaluate the effect of the present invention, a deep learning network designed for MNIST and CIFAR-10 datasets was used. The deep learning network is a VGG model having a multi-layer perceptron (MLP) and a triple inflation coefficient.

For the correction data set, a subset randomly selected from the arbitrary data set was used. In Example of the present invention, a fault rate (FR) and a ratio between stuck-close errors or an open-close ratio (OCR) were variously changed. For example, if the fault rate (FR)=10% and the open-close ratio (OCR)=4, regardless of a target resistance value, it may be expected that about 8% of resistive random access memories (ReRAM) will be stuck to the high resistance state (HRS) and about 2% thereof will be stuck to the low resistance state (LRS).

That is, in Example of the present invention, the fault rate (FR) was varied from 10% to 40% and the open-close ratio (OCR) was used as 5, 1, and ⅕. The reference accuracy was 98.00% for MNIST and 91.27% for CIFAR-10. The reference accuracy is the test accuracy of each BNN model when the stuck-at fault (SAF) does not occur.

In Example of the present invention, according to the fault rate (FR), simple inference (SI) and the free parameter tuning (FPT) of the present invention were compared.

Experiment Result

Referring to the following [Table 1], as the experimental result of using the MNIST and CIFAR-10 data sets in the deep learning network according to Example of the present invention, it was confirmed that when the fault rate (FR) is 10%, the accuracy closest to the reference accuracy was derived from the MNIST and CIFAR-10 data sets. In addition, as the fault rate (FR) increases, it can be seen that the accuracy is considerably higher than that of simple inference (SI).

That is, as described above, the batch normalization (BN) layer in the deep learning network of the present invention is folded into the convolution layer or the fully-connected layer and removed after the average μ and the standard deviation σ are updated, so that there is no need for additional hardware and a huge amount of arbitrary data sets for separate training. In addition, as the fault rate (FR) increases, the FPT according to an embodiment of the present invention is very close to the reference accuracy or has very high accuracy compared to SI in which any mitigation method is not performed, so that the FPT can be proved as a significantly efficient stuck-at fault (SAF) mitigation method.

TABLE 1

| FR | SI | FPT |
|---|---|---|
| MNIST test accuracy | | |
| 10% | 97.36% | 97.47% |
| 20% | 91.85% | 97.21% |
| 40% | 44.23% | 95.07% |
| CIFAR-10 test accuracy | | |
| 10% | 78.18% | 88.83% |
| 20% | 32.46% | 86.08% |
| 40% | 10.08% | 66.30% |

As described above, although the embodiments have been described by the limited embodiments and the drawings, various modifications and variations are possible from the above description by those skilled in the art. For example, even if the described techniques are performed in a different order from the described method, and/or components such as a system, a structure, a device, a circuit, etc. described are coupled or merged in a different form from the described method, or replaced or substituted by other components or equivalents, an appropriate result can be achieved.

Therefore, other implementations, other embodiments, and equivalents to the appended claims fall within the scope of the claims to be described below.

EXPLANATION OF REFERENCE NUMERALS AND SYMBOLS

100: Resistive random access memories (ReRAM)-based deep learning accelerator hardware

What is claimed is:

1. A stuck-at fault mitigation method for resistive random access memory (ReRAM)-based deep learning accelerators comprising: a stuck-at fault confirming step of confirming a distorted output value (Y0) due to a stuck-at fault (SAF) by using a correction data set in a pre-trained deep learning network, by means of ReRAM-based deep learning accelerator hardware;
- an updating step of updating an average (μ) and a standard deviation (σ) of a batch normalization (BN) layer by using the distorted output value (Y0), by means of the ReRAM-based deep learning accelerator hardware;
- a folding step of folding the batch normalization (BN) layer in which the average (μ) and the standard deviation (σ) are updated into a convolution layer or a fully-connected layer, by means of the ReRAM-based deep learning accelerator hardware; and
- a deriving step of deriving a normal output value (Y1) by using the deep learning network in which the batch normalization (BN) layer is folded, by means of the ReRAM-based deep learning accelerator hardware.

2. The stuck-at fault mitigation method for the ReRAM-based deep learning accelerators of claim 1, wherein the deep learning network derives at least one of the distorted output value (Y0) and the normal output value (Y1) by using $$y = \gamma\left(\frac{x-\mu}{\sqrt{\sigma^2 - \varepsilon}}\right) + \beta,$$

based on affine transformation, wherein, y is an output value, x is an input value, μ and σ are the average and the standard deviation as forward parameters, β and γ are a bias value and an affine transformation weight as backward parameters, and ε is a constant.

3. The stuck-at fault mitigation method for the ReRAM-based deep learning accelerators of claim 2, wherein in the updating step, the updating for parameters other than the average (μ) and the standard deviation (σ) of the batch normalization (BN) layer does not occur.

4. The stuck-at fault mitigation method for the ReRAM-based deep learning accelerators of claim 1, wherein in the updating step, when there is no batch normalization (BN) layer in the deep learning network, the batch normalization (BN) layer is added to one side of the convolution layer or the fully-connected layer so that the stuck-at fault is mitigated, and
in the folding step, the batch normalization (BN) layer is folded into the convolution layer or the fully-connected layer so that the deriving step is simplified.

* * * * *